United States Patent [19]

Korsunsky et al.

[11] Patent Number: 4,630,875
[45] Date of Patent: Dec. 23, 1986

[54] CHIP CARRIER SOCKET WHICH REQUIRES LOW INSERTION FORCE FOR THE CHIP CARRIER

[75] Inventors: Iosif Korsunsky, Harrisburg; Dimitry Grabbe, Middletown, both of Pa.

[73] Assignee: AMP Incorporated, Harrisburg, Pa.

[21] Appl. No.: 814,511

[22] Filed: Dec. 18, 1985

Related U.S. Application Data

[63] Continuation-in-part of Ser. No. 627,150, Jul. 2, 1984, abandoned.

[51] Int. Cl.[4] .................. H01R 9/09; H01R 13/62; H01R 13/635
[52] U.S. Cl. .................. 339/17 CF; 339/45 M; 339/74 R; 339/75 MP
[58] Field of Search .......... 339/17 CF, 45 R, 45 T, 339/45 M, 74 R, 75 M, 75 MP, 174

[56] References Cited

U.S. PATENT DOCUMENTS

| | | | |
|---|---|---|---|
| 3,474,387 | 10/1969 | Krum et al. | 339/75 MP |
| 3,753,211 | 8/1973 | Pauza et al. | 339/75 MP |
| 4,270,826 | 6/1981 | Narozny | 339/75 MP |
| 4,349,238 | 9/1982 | Showman et al. | 339/75 M |

FOREIGN PATENT DOCUMENTS

| | | | |
|---|---|---|---|
| 1209568 | 10/1970 | United Kingdom | 339/45 M |
| 587539 | 1/1978 | U.S.S.R. | 339/75 MP |
| 746966 | 7/1980 | U.S.S.R. | 339/75 MP |

*Primary Examiner*—Neil Abrams
*Attorney, Agent, or Firm*—Frederick W. Raring

[57] ABSTRACT

Chip carrier socket 2 comprises a socket body 24 having a rectangular base 30 and walls 34 extending normally from the edges 32 of the base. The walls can be pivotally moved inwardly of the recess which is defined by the walls after a chip carrier 12 has been placed in the recess. A frame 28 is provided in surrounding relationship to the walls 34 and is movable relative thereto between a first position and a second position. When the frame 28 is moved to the second position, the walls 34 are moved inwardly thereby to move the contact terminals 26 in the walls against terminal pads 20 on the leadless chip carrier 12. The frame 28 also may have an ejector means integral therewith which will eject the chip carrier from the socket when the frame is moved from a second position to the first position. The frame may also cam the walls outwardly to permit placement of the chip carrier in the recess under ZIF conditions.

20 Claims, 10 Drawing Figures

CHIP CARRIER SOCKET WHICH REQUIRES LOW INSERTION FORCE FOR THE CHIP CARRIER

RELATIONSHIP TO OTHER PENDING APPLICATIONS

This application is a continuation-in-part of application Ser. No. 627,150 filed July 2, 1984 now abandoned.

FIELD OF THE INVENTION

This invention relates to chip carrier sockets of the type which are adapted to receive a rectangular chip carrier having contact pads on its sides. The socket has contacts which engage the contact pads and serves to connect the pads to conductors on a circuit board or the like.

BACKGROUND OF THE INVENTION

A standard type of housing or carrier for an integrated circuit chip comprises a rectangular body of insulating material having outwardly facing chip carrier side surfaces on which there are provided contact pads or leads which extend from conductors that in turn extend to the integrated circuit chip contained in the chip carrier. When the chip carrier is tested prior to its being placed in service, it is placed in a chip carrier socket temporarily while "burn-in" and tests are carried out. Chip carrier sockets of this type are commonly referred to as "burn-in" sockets and they are used repeatedly for the reason that chip carriers having integrated circuits therein are usually tested at elevated temperatures before being placed in service. After the chip carrier has been tested, it is placed permanently in a chip carrier socket on a circuit board or the like which may be part of electronic equipment.

A known type of chip carrier socket comprises a socket body of insulating material having a recess therein which receives the leadless chip carrier and having contact terminals therein which engage or contact the contact pads on the chip carrier when the chip carrier is placed in the recess. The contact force or contact pressure with which each of the contact terminals engages the contact pads on the chip carrier is an important consideration. This contact force can be relatively low if the contact surfaces are all plated with gold, however, it must be relatively higher if the surfaces are tin plated. In either event, it is important that this contact force be closely controlled in the equipment in which the chip carrier is used. Chip carrier sockets are therefore designed in some instances to have a relatively high contact force and for this reason it is usually difficult to insert the chip carrier into the chip carrier socket; in other words the chip carrier can be placed in the socket only with a relatively high insertion force. The chip carrier socket can be designed such that only a low insertion force is required and insertion is therefore easily carried out if the contact surfaces are gold plated. In either event, the contact force must be controlled carefully when the chip carrier is designed and manufactured.

It would be desirable to have a chip carrier socket having zero insertion force (ZIF) characteristics or low insertion force (LIF) characteristics and in addition having a means closely to control the contact force exerted by the contact terminals in the chip carrier against the contact pad surfaces on the chip carrier. A chip carrier socket having zero or low insertion force characteristics would simplify the operation of placing the chip carrier in the socket recess. At the same time, it would be then possible to achieve a predetermined contact force after the chip carrier was placed in the socket. A chip carrier socket of this type would be particularly desirable in "burn-in" type socket applications because of the fact that the socket is used repeatedly in burn-in and in testing newly manufactured chip carriers. It would also be desirable in those chip carriers used in electronic equipment for the reason that it would facilitate assembly of the chip carrier in the chip carrier socket and permit the operation to be carried out with robotic devices.

It would also be desirable to have a chip carrier socket having an ejection feature for removing the chip carrier from the socket after "burn-in" or at other times should the need arise. The provision of a chip carrier ejector on the socket would be particularly desirable for "burn-in" sockets again because of the fact that a burn-in socket is used repeatedly.

The present invention is directed to the achievement of an improved chip carrier socket having LIF characteristics or ZIF characteristics coupled with a means of controlling the contact force which is exerted on the contact pads of the chip carrier by the terminals in the chip carrier socket. The invention is further directed to the achievement of a chip carrier socket having an ejector means which facilitates removal of the chip carrier from the recess in the chip carrier socket.

THE INVENTION

The invention comprises a chip carrier socket for an integrated circuit chip carrier, the chip carrier being of the type comprising a rectangular chip carrier body having oppositely facing major surfaces and outwardly facing chip carrier side surfaces. The chip carrier side surfaces have spaced apart contact pads thereon which are between the major surfaces. The chip carrier socket comprises a socket body having a rectangular recess therein which is dimensioned to receive the chip carrier. Contact terminals are provided in the socket body which contact the contact pads when the chip carrier is placed in the recess. The chip carrier socket of the present invention is characterized in that the socket body comprises a rectangular base having peripheral edges and having walls extending normally from each of the edges. Each wall extends between the two adjacent corners of the base and is spaced from the adjacent chip carrier socket walls by gaps at the corners of the chip carrier socket body. The chip carrier socket walls define the recess for the chip carrier. The walls each have an internal surface which is opposed to a chip carrier side surface when a chip carrier is placed in the recess and have an external surface which faces outwardly. Each chip carrier socket wall has conpact receiving cavities extending inwardly from its internal surfaces and contact terminals are disposed in the cavities. The walls are connected to the base by integral hinge sections and are stiffly pivotally movable. A frame is provided in surrounding relationship to the walls which comprises a plurality of rails that are joined to each other at their ends. Each rail extends alongside one of the walls and is joined to the next adjacent rail at its ends. The frame is movable towards and away from the base between a first position and a second position, the frame being relatively remote from the base in the first position and being relatively proximate to the base in the second position. Each of the rails and its associated wall have first camming means thereon which is effective upon movement of the frame from the first position to the second position to move the walls pivotally inwardly of the recess, so that upon placement of a chip carrier in the recess when the frame is in the second position and thereafter moving the frame to the second position, the walls will be moved relatively towards the chip carrier side surfaces and the contact terminals will be moved and held against the contact pads on the chip carrier side surfaces.

In accordance with one embodiment of the invention, a cap member is provided for assembly to the outer free ends of the walls and the frame comprises flanges which extend from the cap member and extending over the walls when the cap is assembled to the walls.

In accordance with a further embodiment, the rails of the frame have ejector fingers extending inwardly therefrom which are beneath a chip carrier in the recess when the frame is in the second position so that upon upward movement of the frame from the second position to the first position, the fingers move upwardly and eject the chip carrier from the recess.

A camming means may also be provided for moving the walls pivotally outwardly from the recess when the frame is moved from the second position to the first position so that the contact terminals in the chip carrier socket are moved away from the contact pads on the chip carrier. This feature further facilitates the removal of the chip carrier from the chip carrier socket.

THE DRAWING FIGURES

Figure 1:
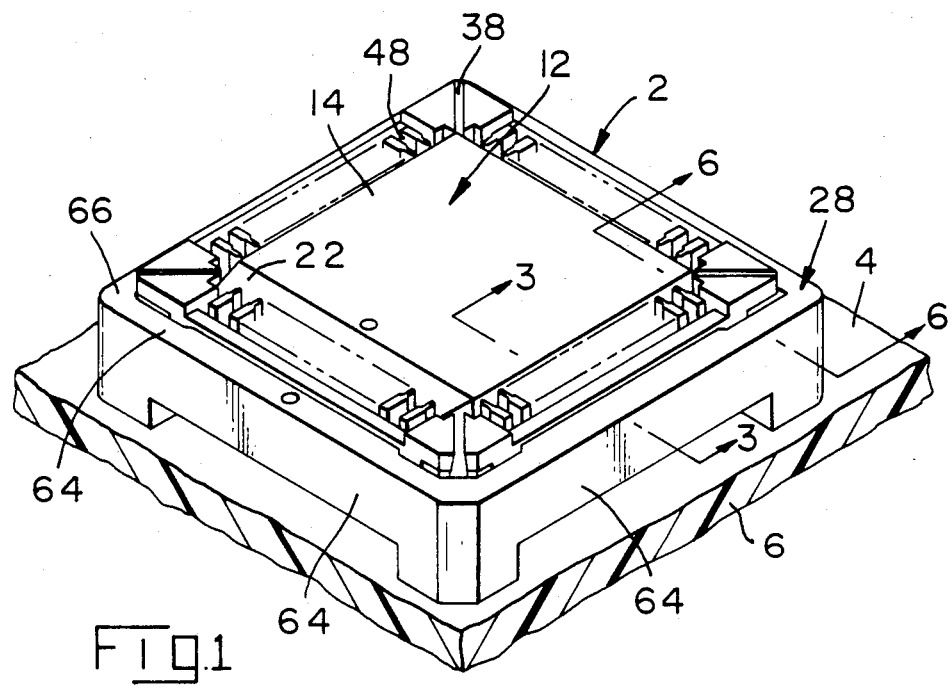
FIG. 1 is a perspective view of a chip carrier socket in accordance with the invention mounted on a circuit board with a chip carrier in the recess of the socket.
Figure 2:
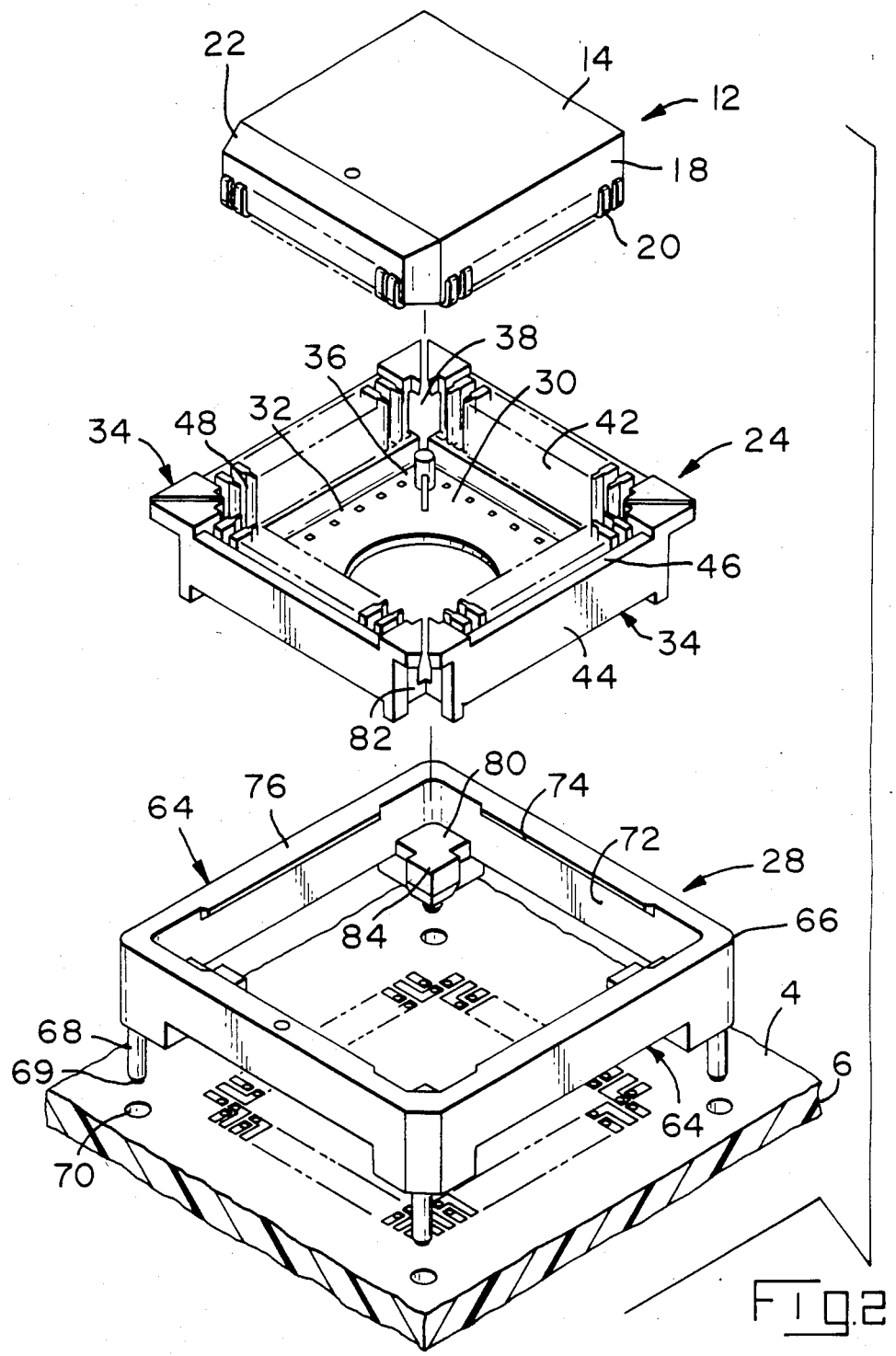
FIG. 2 is a view similar to FIG. 1 showing the parts exploded from each other.
Figure 3:
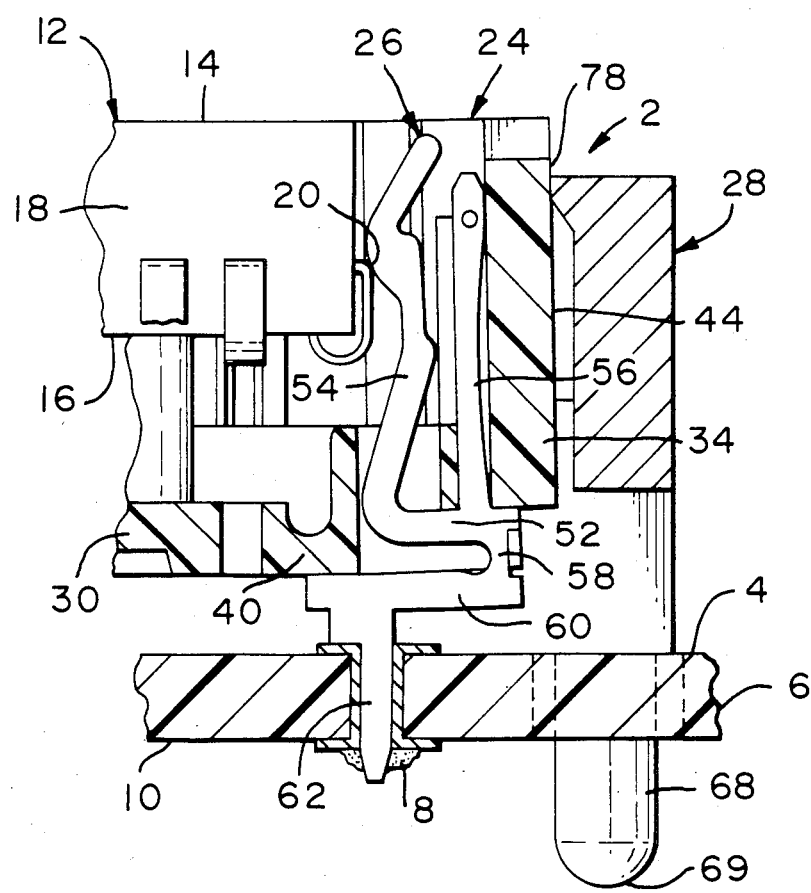
FIG. 3 is a view looking in the direction of the arrows 3—3 of FIG. 1.
Figure 4:
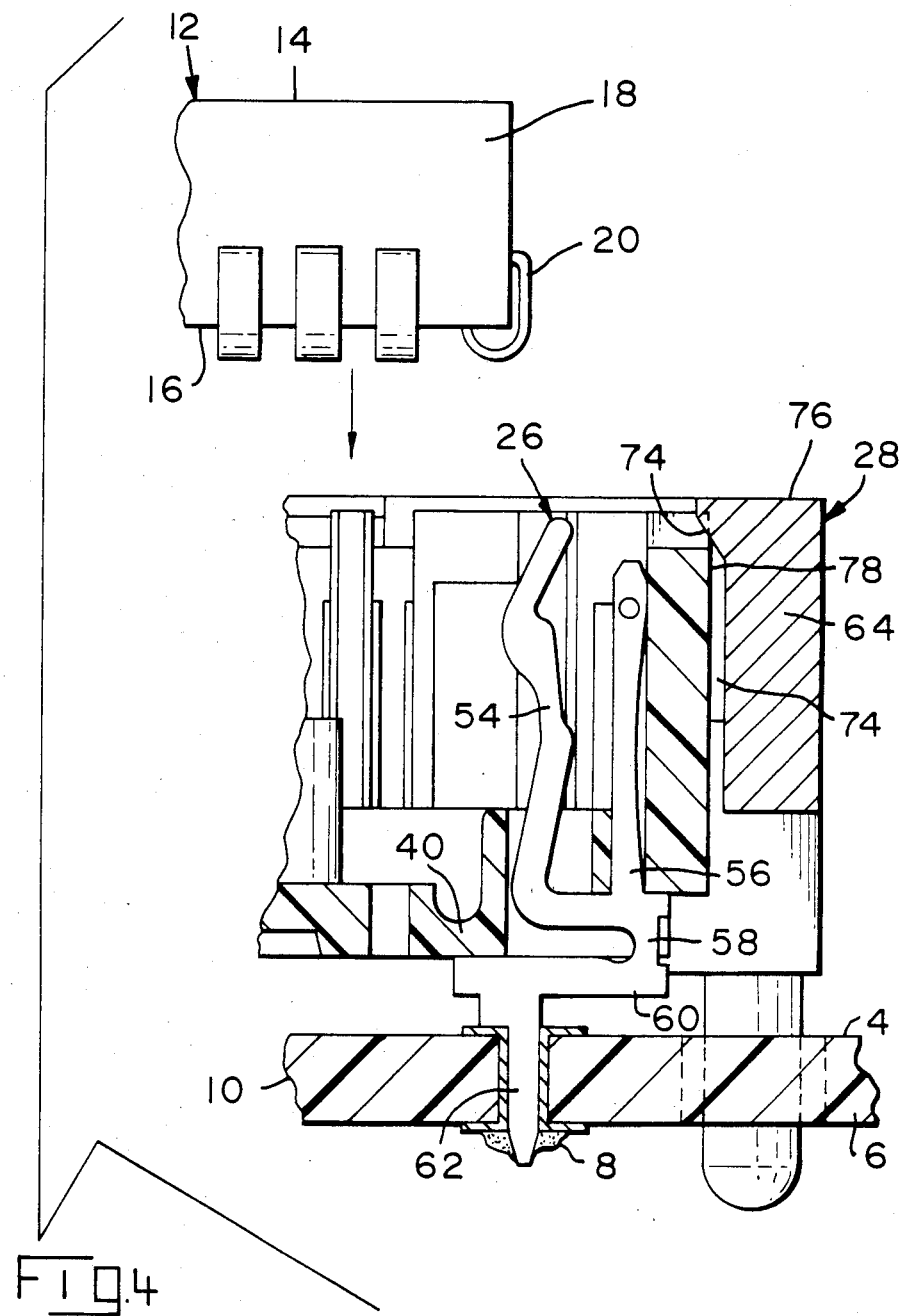
Figure 5:
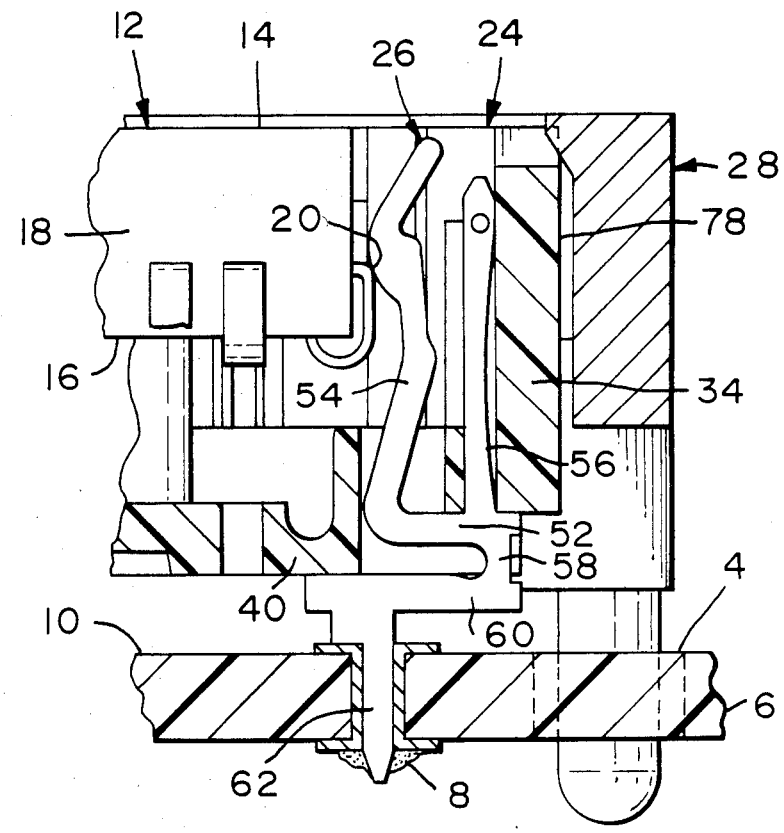
Figure 6:
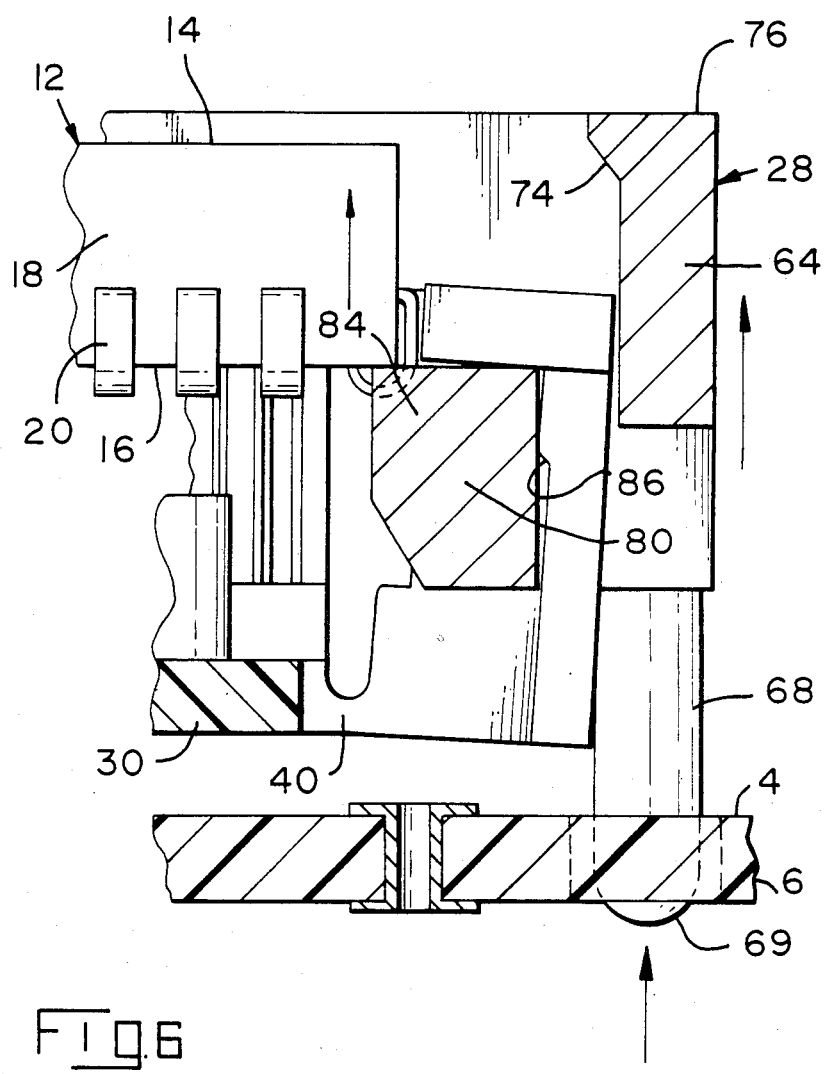
Figure 7:
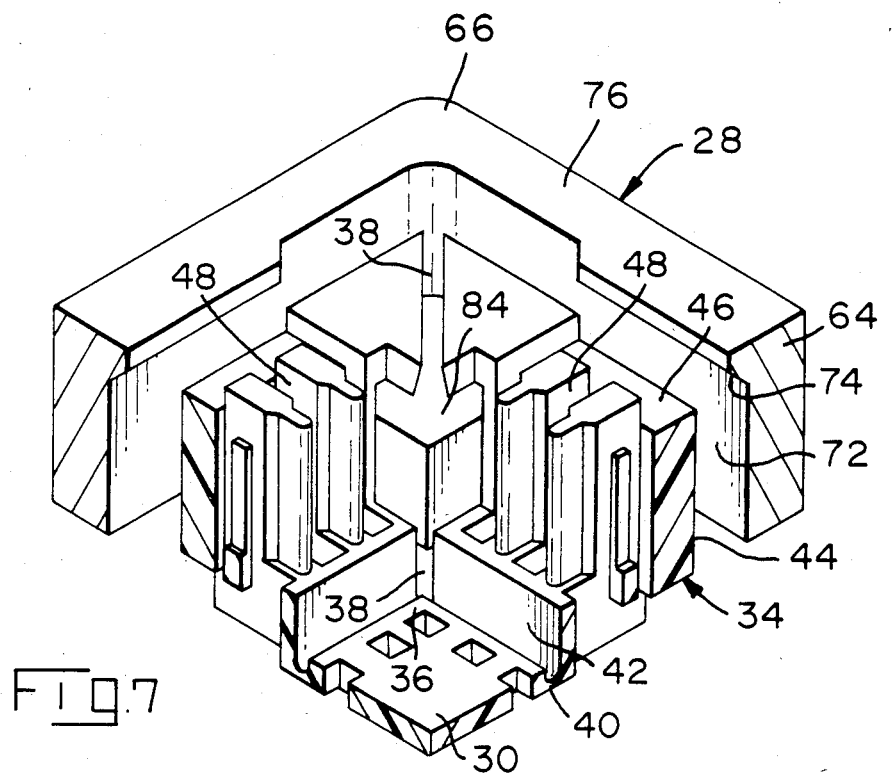
Figure 8:
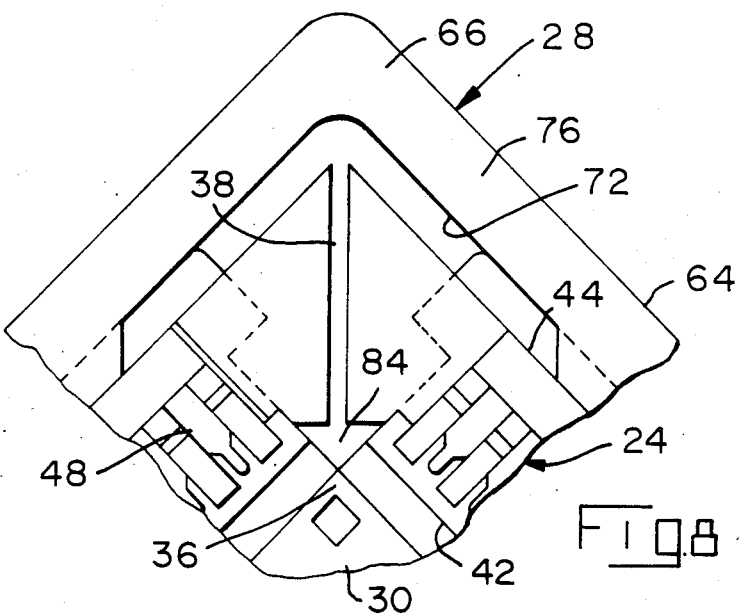
Figure 9:
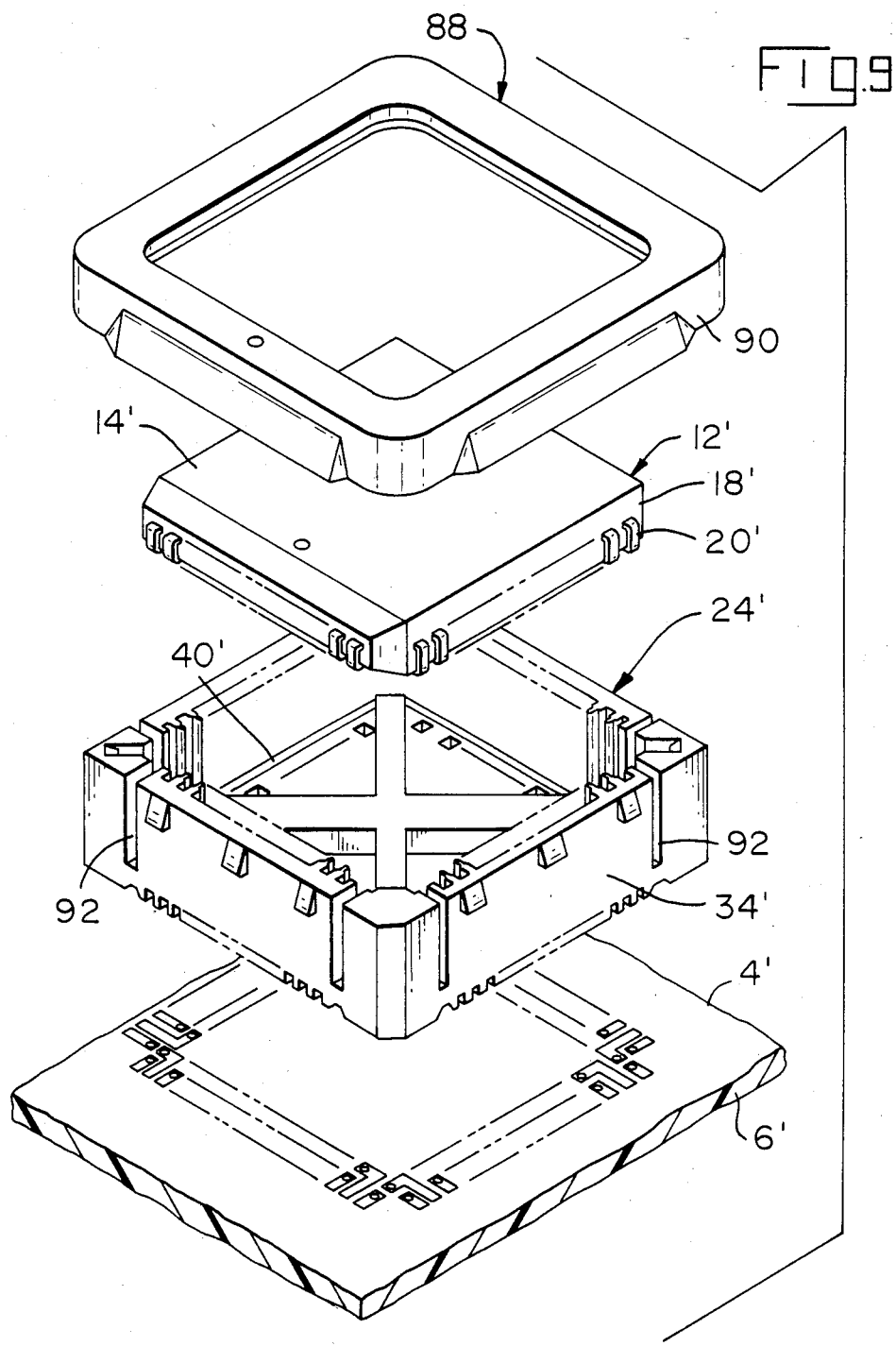

FIGS. 4 and 5 are views similar to FIG. 3 but showing the frame of the chip carrier socket in different positions, FIG. 4 showing the positions of the parts prior to placement of the chip carrier in the recess of the chip carrier socket and FIG. 5 showing the positions of the parts after placement of the chip carrier in the socket recess but prior to movement of the frame from its first position to the position of FIG. 3;

FIG. 6 is a view looking in the direction of the arrows 6—6 of FIG. 1 and showing the manner in which a chip carrier can be ejected from the recess of the chip carrier socket;

FIG. 7 is a fragmentary perspective view of a corner portion of the chip carrier socket;

FIG. 8 is a plan view of the corner portion shown in FIG. 7;

FIG. 9 is a view similar to FIG. 2 showing an alternative embodiment; and

Figure 10:
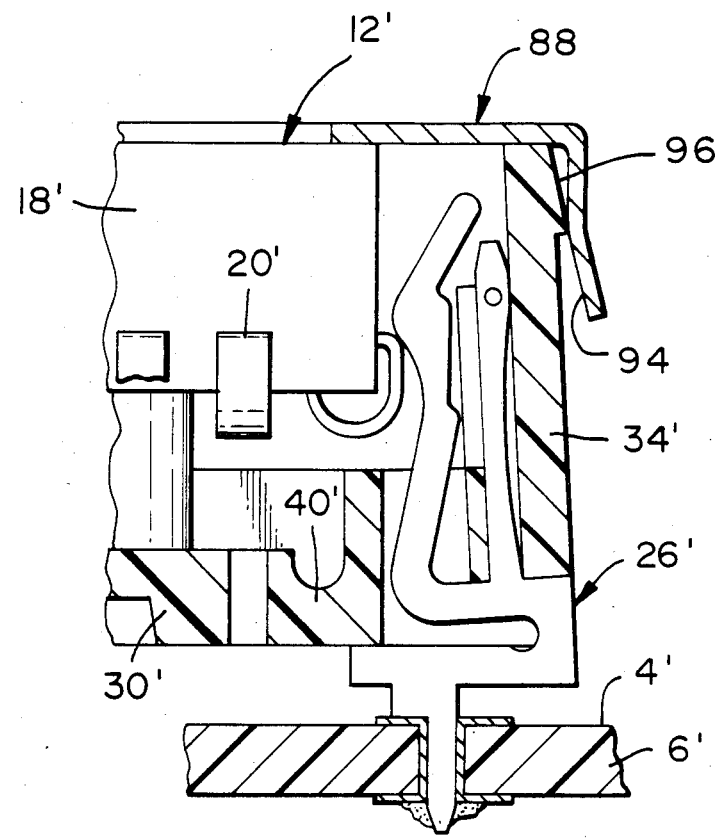

FIG. 10 is a view similar to FIG. 3 but showing the positions of the parts of the alternative embodiment when the chip carrier is positioned in the chip carrier socket.

THE DISCLOSED EMBODIMENT

FIGS. 1 and 2 show a chip carrier socket 2 in accordance with the invention mounted on the upper surface 4 of a circuit board 6. The contact terminals in the socket have post portions 62 which extend through the circuit board 6 to the underside 10 thereof and are soldered as shown at 8, FIG. 3, to conductors on the underside of the board. Under some circumstances, the terminals may be soldered directly to conductors on the upper surface 4 of the circuit board as in surface mounted versions.

The socket has contained therein a leadless chip carrier 12 which comprises a square chip carrier body having upper and lower oppositely facing major surfaces 14, 16 and outwardly facing chip carrier side surfaces 18. Contact pads 20 are provided on the side surfaces 18, these contact pads being the leads which extend from an integrated circuit chip contained in the chip carrier. One end of the chip carrier body may be beveled as shown at 22 to facilitate correct placement of the chip carrier in the socket and for orientation purposes.

The chip carrier socket 2 comprises a socket body 24, terminals 26 in the socket body, and a frame which surrounds the socket body as shown at 28. The socket body 24 is of insulating material, is produced by molding techniques and comprises a recangular base 30 having chip carrier walls 34 extending normally from its side edges 32. The walls 34 do not extend to the corners 36 of the base, but there is a gap 38 between adjacent walls so that each wall is independent of the others. The walls are connected to the base by hinge sections 40, FIG. 3, and they can be independently pivoted inwardly or outwardly of the recess which the walls define and which receives the chip carrier 12. The actual amount of pivotal movement of each wall inwardly or outwardly is very limited and is shown in an exaggerated manner in FIG. 3 for purposes of illustration.

Each wall 34 has an internal surface 42, an external surface 44, and a free upper end 46. Contact receiving cavities 48 extend inwardly from the internal surface 42 and each cavity contains a contact terminal as shown at 26. Terminals of the type shown herein are fully described in application Ser. No. 584,274 filed Feb. 27, 1984 which is hereby incorporated by reference in its entirety. Each terminal has a yoke portion 52, arms 54, 56 extending from the yoke portion, a neck 58 which extends from the yoke portion to a base 60 and a post 62 which extends through the circuit board and is soldered as shown at 8 to a conductor on the underside of the circuit board. The contact surface portion of each terminal 26 which engages the contact pad 20 on the side surface of the chip carrier is on the arm 54 as shown in FIG. 3.

The frame 28 is preferably metallic or ceramic and may be manufactured by powder metallurgy techniques or sintering. It comprises four rails 64 which are joined at their ends 66 to form an open rectangular structure in surrounding relationship to the external surfaces 44 of the walls 34. Each rail extends along one of the walls of the chip carrier socket body and pins 68 are provided at the corners 66 which extend into holes 70 in the circuit board. The frame can be moved from a first or raised position, FIG. 5 to a second or lowered position as shown in FIG. 3. The frame furthermore can be moved above the first position as shown in FIG. 6 and as will be described below when the chip carrier is ejected from the socket.

The rails 64 of the frame have internal surfaces 72 which in turn have inclined camming surface portions 74 adjacent to the upper end 76 of the frame. These inclined camming surface portions cooperate with an edge 78 of the associated socket wall to cam the walls inwardly when the frame is moved downwardly to its second position. The edges 78 thus function as cam followers.

When the chip carrier socket does not have a chip carrier therein, the parts will be in the positions of FIG. 4. When it is desired to place a chip carrier in the recess 5 of the socket, the chip carrier is moved downwardly from the position of FIG. 4 to the position of FIG. 5. If the contact surfaces of the chip carrier and the terminals are tin plated, the chip carrier and socket are preferably designed such that there is some resistance to movement of the chip carrier into the recess in the socket; in other words, there should be a very slight interference fit between the contact portions of the terminals and the contact pads on the chip carrier. If the contact surfaces are gold plated, a slight clearance may be provided. The chip carrier can thus be moved into the recess of the chip carrier socket with a very low insertion force or with no insertion force, that is, under ZIF conditions. After the chip carrier has been placed in the recess (FIG. 5) the frame 26 is moved downwardly to its second position, FIG. 3, and the camming surface portions 74 move over the edges 78 and pivot the walls 34 inwardly so that the contact portions of the terminals on the arms 54 are urged against the contact pads 20 with a precisely predetermined force. After the chip carrier has been placed in the socket and the frame has been moved downwardly, there is no possibility of relaxation since the frame is rigid and the contact force exerted by each arm 54 against the adjacent contact pad 20 will be stable over an extended time period.

The socket body 24 or 24' is advantageously molded of a plastic material which is relatively firm and strong and which has good high temperature properties coupled with sufficient toughness to permit the limited pivotal movement of the walls 34. Good results have been obtained with a poly-benzoate-naphthoate composition, Vectra A-130 which can be obtained from Celanese Speciality Operations, 86 Morris Avenue, Summit, N.J. Many other insulating materials can be used. The socket body is relatively rigid and the pivotal movement of the walls is only very slight.

The features of the invention described thus far therefore permit easy insertion of the chip carrier into the socket under zero insertion force or extremely low insertion force conditions coupled with precisely controlled contact forces at the electrical interface of the terminals and the contact pads. The actual contact force exerted by the terminal on the contact pad 20 of the chip carrier can furthermore be precisely controlled by changing the characteristics of the camming surface 74 and/or the dimensions of the frame. For example, if the terminals 26 and the contact pads 20 are tin plated so that a high contact force is required, the frame 28 can be designed such that it will produce the desired relatively high contact force. On the other hand, if the contact surfaces are all gold plated and it is desired to have a relatively lower contact force, this result can also be achieved. This feature of the invention is particularly desirable for burn-in type sockets since it permits testing of the chip carrier under precisely controlled conditions.

The embodiments of the invention shown in FIGS. 1 through 8 is further provided with an ejector for removing the chip carrier 12 from the recess of the socket body 24 which will now be described.

The frame 28 has inwardly extending ejector fingers at its corners as shown at 80, the ends 84 of these fingers being dimensioned to be received within corner recesses 82 which are between adjacent walls 34 of the socket body. As shown best in FIGS. 7 and 8, the ends of the fingers 84 will therefore be beneath the lower major surface 16 of a chip carrier 12 in the recess of the socket body when the chip carrier is fully inserted as shown in FIG. 3. When the frame 28 is moved upwardly from the position of FIG. 3 to the position of FIG. 6, that is, from its second position to its first position and slightly past its first position, these fingers 80 will push the chip carrier 12 upwardly and from the recess of the chip carrier socket. In addition, the fingers function as cams and cooperate with cam follower surface portions 86, FIG. 6, on the interior surfaces 42 of the walls 34 at the ends thereof and flex the walls outwardly and away from the central recess of the carrier body 24. The contact terminals are thereby moved away from the contact pads on the chip carrier and the chip carrier is removed under true zero insertion force conditions. As shown also in FIG. 6, when the frame is moved to its uppermost position, the chip carrier is well above the upper end of the socket body 24.

The provision of the chip carrier ejection feature described above can be exploited to achieve fully automatic ejection or removal of the chip carrier 12 from the socket 2 using automatic machinery and/or robotic devices. As shown by FIG. 6, the frame 28 can be moved upwardly by pushing on the lower ends 69 of the guide pins 68 as indicated by the arrow in FIG. 6. The chip carrier 12 can then be removed by a robotic device. Alternatively, the circuit board 6 can be inverted from the position of FIG. 6 and the ends of the pins pushed downwardly so that the chip carrier will fall out of the socket by gravity. These techniques will be particularly useful in burn-in or testing procedures. The entire operation can be carried out automatically by mounting the circuit board 6 on a conveyer and transporting it through apparatus for carrying out the test procedures.

If the gold plated contact surfaces are used, the camming surfaces 86 make possible insertion of the chip carrier 12 into the socket under true ZIF conditions in that the frame 28 can be moved to the position of FIG. 6 so that the recess defined by the walls 34 is enlarged at its upper end and the contact pads 20 on the chip carrier will not touch the contact terminals during insertion. Again, the procedure can be carried out with a robot or other automatic machine.

The chip carrier ejection and removal features of the invention as illustrated in FIGS. 6 through 9 are of particular convenience in burn-in type chip carrier sockets for the reason that it is desirable that the chip carrier be handled carefully when it is placed in the burn-in socket so that no damage will be done to the chip carrier and the contact pads on its surface. Also, it will be apparent that all of the movements illustrated in FIGS. 6 through 8, that is, the movement of the frame upwardly and the movement of the chip carrier permit the use of robotic apparatus in carrying out the testing process. A chip carrier being tested can therefore be placed in the socket by a robotic device and can be removed after the tests have been completed. As noted above, the contact force can be closely controlled by virtue of the camming surface on the frame so that the testing and burn-in process is carried out under precisely controlled conditions.

FIGS. 9 and 10 show an alternative embodiment of the invention which does not have the chip carrier ejection features of the previously described embodiment but which does have a frame in surrounding relationship to pivoted walls thereby to achieve placement of the chip carrier in the socket with relative ease and predetermine contact forces as described above. The structural features of the embodiment of FIGS. 9 and 10 are identified with the same reference numerals, differentiated by prime marks, as are used to identify the features of the embodiment of FIGS. 1 through 8. New reference numerals are used to describe the structural features which are not common to the both embodiments.

The embodiment of FIG. 9 has a metallic cap member 88 which is designed to be assembled to the upper ends of the walls and the cap member has flanges 90 that serve as the rails and which flex the walls inwardly when the cap is assembled to the socket body as shown in FIG. 10. The walls are provided with slots 92 at their ends and the hinged section is provided as described below. The camming surfaces are provided on the flanges as shown at 94 at on the external surfaces of the walls as shown at 96. The embodiment of FIGS. 9 and 10 is probably better suited for use on those chip carrier sockets which are used on circuit boards that are in turn used on electronic equipment.

The invention thus permits easy insertion of a chip carrier into a chip carrier socket and it further permits precise control over the contact force exerted by the contact terminals in the socket on the contact pads of the chip carrier. As a result, it is not necessary to design one type of terminal or socket for chip carriers having tin plated contact pads and another socket and terminal type for chip carriers having gold plated contact pads. It is merely necessary to make a slight adjustment in the camming surface of the frame, 88 in FIG. 10 and 28 in FIG. 2, to accommodate the different types of platings which require differing contact forces. In addition, the ejection feature as shown in the embodiment of FIGS. 1 through 8 facilitates removal of the chip carrier from the chip carrier socket if this advantage is desired.

What is claimed is:

1. A chip carrier socket for an integrated circuit chip carrier, the chip carrier comprising a rectangular chip carrier body having oppositely facing major surfaces and outwardly facing chip carrier side surfaces which extend normally of the major surfaces, the chip carrier side surfaces having spaced-apart contact pads thereon which are between the major surfaces, the socket comprising a socket body having a rectangular recess therein which is dimensioned to receive the chip carrier, contact terminals in the socket body which contact the contact pads when the chip carrier is placed in the recess, the chip carrier socket being characterized in that:

the socket body comprises a rectangular base having peripheral edges and having a chip carrier socket wall extending normally from each of the edges, each wall extending between two adjacent corners of the base and being spaced from the adjacent walls by gaps at the corners of the chip carrier socket body, the chip carrier socket walls defining the recess for the chip carrier, the walls each having an internal surface which is opposed to a chip carrier side surface when a chip carrier is placed in the recess and having an external surface which faces outwardly, each wall having terminal-receiving cavities extending inwardly thereof from its internal surface, the contact terminals being in the cavities, the walls being connected to the base by integral hinge sections and being stiffly pivotally movable, a rigid frame is provided in surrounding relationship to the walls, the frame comprising a plurality of rails which are joined to each other at their ends, each rail extending alongside one of the walls and being joined to the next adjacent rail at its ends, the frame being movable towards and away from the base between a first position and a second position, the frame being relatively remote from the base in the first position and being relatively proximate to the base in the second position, each of the rails and its associated wall having first camming means thereon, the first camming means being effective, upon movement of the frame from the first position to the second position, to move the walls pivotally inwardly of the recess whereby, upon placement of the chip carrier in the recess when the frame is in the first position and thereafter moving the frame to the second position, the walls will be moved relatively towards the chip carrier side surfaces and the contact terminals will be moved and held against the contact pads on the chip carrier side surfaces.

2. A chip carrier socket as set forth in claim 1 characterized in that the walls have free outer ends, the first camming means comprising cam follower surface portions on the free outer ends of the walls.

3. A chip carrier socket as set forth in claim 2 characterized in that a cap member is provided for assembly to the free outer ends of the walls, the frame comprising flanges which extend from the cap member.

4. A chip carrier socket as set forth in claim 3 characterized in that the first camming means comprises camming surface portions on the flanges which cooperate with the cam follower surface portions on the free outer ends of the walls.

5. A chip carrier socket as set forth in claim 2 characterized in that the chip carrier socket is mounted on one surface of a panel member such as a circuit board, the frame having pins integral therewith which extend through holes in the circuit board.

6. A chip carrier socket as set forth in either of claims 2 or 5 characterized in that the rails of the frame have ejector fingers extending inwardly of the frame therefrom, the fingers being beneath a chip carrier in the recess when the frame is in the second position whereby upon movement of the frame from the second position to the first position, the fingers move upwardly and eject the chip carrier from the recess.

7. A chip carrier socket as set forth in claim 6 characterized in that fingers extend inwardly of the frame at the corners thereof.

8. A chip carrier socket as set forth in claim 7 characterized in that the frame and the walls have second camming means thereon, the second camming means being effective, upon movement of the frame from the second position towards the first position to cam the walls pivotally outwardly from the recess thereby to move the contact terminals away from the side surfaces of the chip carrier and permit free movement of the chip carrier into and from the recess during insertion and ejection.

9. A chip carrier socket as set forth in claim 8 characterized in that the second camming means comprises second camming surface portions on the fingers and second cam follower surface portions on the walls.

10. A chip carrier socket as set forth in either of claims 2 or 4 characterized in that the frame and the walls have second camming means thereon, the second camming means being effective, upon movement of the frame from the second position towards the first position to cam the walls pivotally outwardly from the recess thereby to move the contact terminals away from the side surfaces of the chip carrier and permit easy removal of the chip carrier from the recess.

11. A chip carrier socket as set forth in claim 10 characterized in that the second camming means comprises second camming surface portions on the frame and second cam follower surface portions on the walls.

12. A chip carrier socket for an integrated circuit chip carrier, the chip carrier comprising a rectangular chip carrier body having oppositely facing major surfaces and outwardly facing chip carrier side surfaces which extend normally of the major surfaces, the chip carrier side surfaces having spaced apart contact pads thereon which are between the major surfaces, the socket comprising a socket body having a rectangular recess therein which is dimensioned to receive the chip carrier, contact terminals in the socket body which contact the contact pads when the chip carrier is placed in the recess, the chip carrier socket being characterized in that:

the socket body comprises a rectangular base having peripheral edges and having a chip carrier wall extending from each of the edges, each wall extending between two adjacent corners of the base, the chip carrier socket walls defining the recess for the chip carrier, the walls each having an internal surface which is opposed to a chip carrier side surface when a chip carrier is placed in the recess and having an external surface which faces outwardly, each chip carrier wall having contact-receiving cavities extending inwardly thereof from its internal surface, the contact terminals being in the cavities, a frame is provided in surrounding relationship to the walls, the frame being movable towards and away from the base between a first position and a second position, the frame being relatively remote from the base in the first position and being relatively proximate to the base in the second position, the frame having ejector fingers extending inwardly therefrom, the fingers being beneath a chip carrier in the recess when the frame is in the second position whereby upon movement of the frame from the second position towards the first position, the fingers move upwardly and eject the chip carrier from the recess.

13. A chip carrier socket as set forth in claim 12 characterized in that the fingers are at the corners of the frame.

14. A chip carrier socket as set forth in claim 13 characterized in that the frame comprises rails which extend along the external side surfaces of the walls.

15. A chip carrier socket for an integrated circuit chip carrier, the chip carrier comprising a rectangular chip carrier body having oppositely facing major surfaces and outwardly facing chip carrier side surfaces which extend normally of the major surfaces, the chip carrier side surfaces having spaced-apart contact pads thereon which are between the major surfaces, the socket comprising a socket body having a rectangular recess therein which is dimensioned to receive the chip carrier, contact terminals in the socket body which contact the contact pads when the chip carrier is placed in the recess, the chip carrier socket being characterized in that:

the socket body comprises a rectangular base having peripheral edges and having a chip carrier socket wall extending normally from each of the edges, each wall extending between two adjacent corners of the base and being spaced from the adjacent walls by gaps at the corners of the chip carrier socket body, the chip carrier socket walls defining the recess for the chip carrier, the walls each having an internal surface which is opposed to a chip carrier side surface when a chip carrier is placed in the recess and having an external surface which faces outwardly, each wall having terminal-receiving cavities extending inwardly thereof from its internal surface, the contact terminals being in the cavities, the walls being connected to the peripheral edges of the base by integral hinge sections and being stiffly pivotally movable, with the hinge sections serving as pivotal axes, outwardly of the recess, a cam is provided on the socket body and is movable relative thereto, the cam and the walls having camming means which are effective, upon movement of the cam relative to the body, to pivotally move the walls outwardly of the recess thereby to enlarge the recess and permit placement of the leadless chip carrier in the recess.

16. A chip carrier socket as set forth in claim 15 characterized in that the cam comprises a camming frame in surrounding relationship to the walls.

17. A chip carrier socket for an integrated circuit chip carrier, the chip carrier comprising a rectangular chip carrier body having oppositely facing major surfaces and outwardly facing chip carrier side surfaces which extend normally of the major surfaces, at least two of the chip carrier side surfaces having spaced-apart contact pads thereon which are between the major surfaces, the socket comprising a socket body having a rectangular recess therein which is dimensioned to receive the chip carrier, contact terminals in the socket body which contact the contact pads when the chip carrier is placed in the recess, the chip carrier socket being characterized in that:

the socket body comprises a rectangular base having peripheral edges and having a chip carrier socket wall extending normally from at least two of the edges which are opposite to each other, each wall extending between two adjacent corners of the base, the chip carrier socket walls defining the recess for the chip carrier, the walls each having an internal surface which is opposed to a chip carrier side surface when a chip carrier is placed in the recess and having an external surface which faces outwardly, each wall having terminal-receiving cavities extending inwardly thereof from its internal surface, the contact terminals being in the cavities, the walls being connected to the peripheral edges of the base by integral hinge sections and being stiffly pivotally movable, with the hinge sections serving as pivotal axes, outwardly of the recess, a cam is provided on the socket body and is movable relative thereto, the cam and the walls having camming means which are effective, upon movement of the cam relative to the body, to pivotally move the walls outwardly of the recess thereby to enlarge the recess and permit placement of the leadless chip carrier in the recess.

18. A chip carrier socket as set forth in claim 17 characterized in that the cam comprises a camming frame in surrounding relationship to the walls.

19. A chip carrier socket for an integrated circuit chip carrier, the chip carrier comprising a rectangular chip carrier body having oppositely facing major surfaces and outwardly facing chip carrier side surfaces which extend normally of the major surfaces, the chip carrier side surfaces having spaced-apart contact pads thereon which are between the major surfaces, the socket comprising a socket body having a rectangular recess therein which is dimensioned to receive the chip carrier, contact terminals in the socket body which contact the contact pads when the chip carrier is placed in the recess, the chip carrier socket being characterized in that:

the socket body comprises a rectangular base having peripheral edges and having a chip carrier socket wall extending normally from at least two of the edges which are opposite to each other, each wall extending between two adjacent corners of the base, the chip carrier socket walls defining the recess for the chip carrier, the walls each having an internal surface which is opposed to a chip carrier side surface when a chip carrier is placed in the recess and having an external surface which faces outwardly, the walls having terminal-receiving cavities extending inwardly thereof from its internal surface, the contact terminals being in the cavities, the walls being connected to the base by integral hinge sections and being stiffly pivotally movable, a rigid frame is provided in surrounding relationship to the walls, the frame comprising a plurality of rails which are joined to each other at their ends, each rail being joined to the next adjacent rail at its ends, the frame being movable towards and away from the base between the first position and a second position, the frame being relatively remote from the base in the first position and being relatively proximate to the base in the second position, the rails and their associated walls having first camming means thereon, the first camming means being effective, upon movement of the frame from the first position to the second position, to move the walls pivotally inwardly of the recess whereby, upon placement of the chip carrier in the recess when the frame is in the first position and thereafter moving the frame to the second position, the walls will be moved relatively towards the chip carrier side surfaces and the contact terminals will be moved and held against the contact pads on the chip carrier side surfaces.

20. A chip carrier socket as set forth in claim 19 characterized in that the walls have free outer ends, the first camming means comprising cam follower surface portions on the free outer ends of the walls.

* * * * *